United States Patent
Nakamura

(10) Patent No.: US 6,175,086 B1
(45) Date of Patent: Jan. 16, 2001

(54) METHOD FOR MOUNTING TERMINAL ON CIRCUIT BOARD AND CIRCUIT BOARD

(75) Inventor: Satoshi Nakamura, Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/180,979

(22) PCT Filed: May 28, 1997

(86) PCT No.: PCT/JP97/01837

§ 371 Date: Nov. 18, 1998

§ 102(e) Date: Nov. 18, 1998

(87) PCT Pub. No.: WO97/46059

PCT Pub. Date: Dec. 4, 1997

(30) Foreign Application Priority Data

May 29, 1996 (JP) .................................................. 8-134722

(51) Int. Cl.[7] .............................. H01R 12/04; H05K 1/11
(52) U.S. Cl. .............................. 174/261; 29/840; 29/843
(58) Field of Search .................... 29/840, 843; 174/256, 174/261; 361/767, 772, 774, 777; 257/735, 779, 690, 692, 693, 694, 695, 696, 697, 666

(56) References Cited

U.S. PATENT DOCUMENTS

| | | | | |
|---|---|---|---|---|
| 5,428,505 | * | 6/1995 | Sakemi et al. | 361/777 |
| 5,453,581 | * | 9/1995 | Liebman et al. | 174/261 |
| 5,593,080 | * | 1/1997 | Teshima et al. | 228/39 |
| 5,677,567 | | 10/1997 | Ma et al. | 257/666 |
| 5,743,007 | * | 4/1998 | Onishi et al. | 29/840 |
| 6,060,769 | | 5/2000 | Wark | 257/266 |

FOREIGN PATENT DOCUMENTS

| | | |
|---|---|---|
| 48-31459 | 4/1973 | (JP) . |
| 49-28876 | 3/1974 | (JP) . |
| 52-118262 | 10/1977 | (JP) . |
| 58-111394 | 7/1983 | (JP) . |
| 60-107896 | 6/1985 | (JP) . |
| 60-260192 | 12/1985 | (JP) . |
| 63-296391 | 12/1988 | (JP) . |
| 2-110994 | 4/1990 | (JP) . |
| 3-225998 | 10/1991 | (JP) . |
| 4-271190 | 9/1992 | (JP) . |
| 7-235762 | 9/1995 | (JP) . |
| 9-107173 | 4/1997 | (JP) . |

* cited by examiner

*Primary Examiner*—Jeffrey Gaffin
*Assistant Examiner*—Jeremy Norris
(74) *Attorney, Agent, or Firm*—Merchant & Gould P.C.

(57) ABSTRACT

The method for installing terminals comprises a coating step for coating solder paste (3) onto a desired circuit board (1), a superimposing step for superimposing the connecting end (4a) of a terminal (4) having a connecting end (4a) and non-connecting end (4b), and a step for heating and melting the solder paste in order that the connecting end (4a) is soldered to the circuit board (1). In the aforementioned coating step, a plurality of mutually separate solder paste coated regions (3a–3d) are provided on the circuit board (1). In the aforementioned superimposing step, the connecting end (4a) is superimposed such that it extends over the aforementioned plurality of solder paste coated regions (3a–3d).

12 Claims, 9 Drawing Sheets

METHOD FOR MOUNTING TERMINAL ON CIRCUIT BOARD AND CIRCUIT BOARD

TECHNICAL FIELD

The present invention relates to a method for installing terminals on a circuit board comprising desired electronic circuits and electrical circuits, and to a circuit board used in this method.

BACKGROUND ART

FIG. 18 shows one example of a conventional structure wherein terminals are installed on a circuit board. In the structure illustrated in this diagram, terminal 9 has a thin plate shape and is made from metal, and it comprises a connecting end 9a and a non-connecting end 9b. The connecting end 9a is soldered to the circuit board 1E, whilst the non-connecting end 9b projects externally from the circuit board 1E. By adopting a composition of this kind, it is possible to bend the aforementioned non-connecting end, if necessary, as indicated by the imaginary line in the diagram, and this is convenient for making the non-connecting end 9b into the electrode of a cell, or the terminal of a further circuit board, or the like.

Since the task of soldering the aforementioned terminal 9 to the circuit board is carried out manually by an operator, the work efficiency is poor. Therefore, conventionally, reflow soldering has been adopted as a method for soldering the aforementioned terminal 9. This reflow soldering method comprises a step of coating solder paste onto the surface of the circuit board 1E, a step of superimposing the aforementioned connecting end 9a over the region of the board coated with the solder paste, and a step of heating and melting the aforementioned solder paste, and this sequence of steps can be automated.

However, in the prior art, the following problems occur when the connecting end 9a is soldered to the circuit board 1E by means of a reflow soldering method.

Namely, as shown in FIG. 19 for example, in a case where the two end regions 9c, 9d of a terminal 9A of a set length are superimposed on two regions 35, 35 coated with solder paste, a self-alignment effect is obtained. This is due to the fact that when the solder paste in the aforementioned two regions 35, 35 coated with solder paste are heated and melted, the surface tension of the molten solder acts respectively on each end region 9c, 9d, and a force aligning the whole of the terminal 9A with the aforementioned two solder paste coated regions 35, 35 is exhibited. In order to obtain a self-alignment effect in this way by using a reflow soldering method, it is necessary for the surface tension of the molten solder to act on the terminal at a plurality of points.

However, in the structure illustrated in FIG. 18, only connecting end 9a of the aforementioned terminal 9 is soldered to the circuit board 1E, and therefore the surface tension of the molten solder only acts on this portion of the terminal. Therefore, in the prior art, in a case where the aforementioned terminal 9 is installed on the circuit board 1E, a problem arises in that no self-alignment effect is obtained and therefore positional accuracy of the terminal 9 declines.

Conventionally, as means for raising the positional accuracy of the terminal 9, pins for registering the location of the terminal 9 may be provided on the circuit board 1E. However, in the case of means of this kind, the aforementioned pins present an obstacle when installing the terminal 9 on the aforementioned circuit board 1E, and there have been instances where automatic installation of the terminal 9 by means of an automatic mounting device has been difficult to implement. Moreover, problems have also arisen in that the task of providing the aforementioned pins on the circuit board 1E in advance is complicated.

DISCLOSURE OF THE INVENTION

It is an object of the present invention to provide a method for installing terminals on a circuit board, whereby the aforementioned problems can be resolved or alleviated. Moreover, it is a further object of the present invention to provide a circuit board on which the aforementioned method can be implemented appropriately.

A first aspect of the present invention is a method for installing terminals on a circuit board comprising a coating step for coating solder paste onto a desired circuit board, a superimposing step for superimposing the connecting end of a terminal comprising a connecting end and a non-connecting end onto a region where the solder paste is coated, and a step for heating and melting the solder paste in order to solder the connecting end to the circuit board, characterized in that, in the coating step, a plurality of mutually separated solder paste coated regions are provided on the circuit board; and in the superimposing step, the connecting end is superimposed such that it extends over the plurality of solder paste coated regions.

A second aspect of the present invention is a circuit board whereon solder paste is coated for soldering the connecting end of a terminal comprising a connecting end and a non-connecting end, characterized in that a plurality of mutually separated solder paste coated regions are provided by coating the solder paste onto a plurality of regions separately, and the plurality of solder paste coated regions are located in mutually proximate positions whereby the connecting end can be superimposed such that it extends over the solder paste coated regions.

Desirably, the solder paste coated regions are provided in at least three or more positions, each of these solder paste coated regions being mutually separated by an interval in both the longitudinal direction and the lateral direction of the aforementioned terminal.

Desirably, a pad region having an approximate square shape in plan view for providing an electrical connection with the terminal is provided on the circuit board, and the plurality of solder paste coated regions are provided in the four corner regions of the pad region.

Desirably, a further solder paste coated region separated from the aforementioned plurality of solder paste coated regions is provided in approximately the central portion of the pad region.

Desirably, the plurality of solder paste coated regions is provided by forming a plurality of mutually separated metal surface regions and coating the solder paste in a distributed manner onto the respective surfaces of this plurality of metal surface regions.

A third aspect of the present invention is a method for installing terminals on a circuit board comprising a coating step for coating solder paste onto a desired circuit board, a superimposing step for superimposing the connecting end of a terminal comprising a connecting end and a non-connecting end onto a region where the solder paste is coated, and a step for heating and melting the solder paste in order to solder the connecting end to the circuit board, characterized in that, in the coating step, a solder paste coated region comprising a plurality of protruding regions at the outer perimeter thereof is provided on the circuit board; and in the superimposing step, the connecting end is superimposed on the solder paste coated region such that the plurality of protruding regions extend beyond the connecting end.

A fourth aspect of the present invention is a circuit board whereon solder paste is coated for soldering the connecting end of a terminal comprising a connecting end and a non-connecting end, characterized in that the solder paste is coated in a shape comprising a plurality of protruding regions which are capable of projecting beyond the connecting end when the connecting end is superimposed on the solder paste coated region.

Desirably, the connecting end comprises a first edge extending in the lateral direction of the terminal and two second edges extending in the longitudinal direction of the terminal and connecting with the first edge, and the plurality of protruding regions are provided in at least three or more locations, in such a manner that they project beyond the first edge and the two second edges, respectively.

The various characteristics and advantages of the present invention shall become apparent by means of the embodiments described hereinafter with reference to the accompanying drawings.

BRIEF DESCRIPTION OF THE DRAWINGS

FIG. 14a is a principal plan view showing a state where solder paste is coated onto the printed circuit board illustrated in FIG. 13a.

BEST MODE FOR CARRYING OUT THE INVENTION

Below, embodiments of the present invention are described with reference to the drawings.

Figure 1:
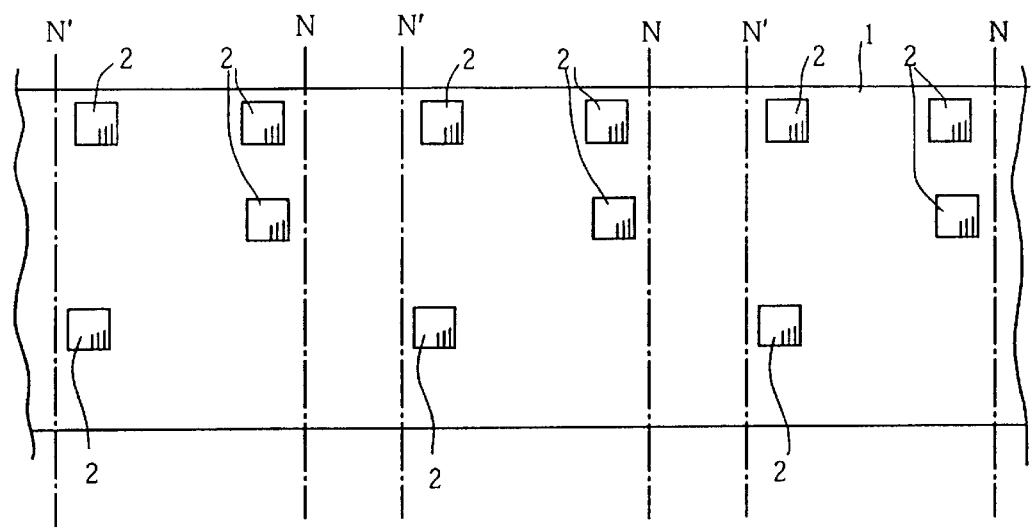
FIG. 1 is a principal plan diagram showing one example of a printed circuit board to which the method for installing terminals on a circuit board relating to the present invention is applied.

These embodiments will be described by taking as an example a case where an electronic circuit device for protecting a rechargeable cell is manufactured using the printed circuit board 1 illustrated in FIG. 1. The aforementioned printed circuit board 1 is, for example, made from glass epoxy resin, and a plurality of pad regions 2 made from copper foil are provided on the surface thereof. Each of these pad regions 2 has an approximate square shape in plan view. Although omitted from the drawings, a plurality of electrically conductive wiring patterns which connect to the aforementioned plurality of pad regions 2 is formed on the surface of the printed circuit board 1, and by installing prescribed electronic components on the aforementioned printed circuit board 1, it is possible to fabricate a protective circuit for a rechargeable cell. The aforementioned printed circuit board 1 has an elongated shape in the lateral direction in FIG. 1. In principle, the aforementioned plurality of conductive wiring patterns and the aforementioned plurality of pad regions 2 are provided in the longitudinal direction of the printed circuit board 1, in such a manner that multiple protective circuits for a rechargeable cell can be fabricated on the aforementioned printed circuit board 1. The imaginary lines N, N' shown in FIG. 1 indicate positions for cutting the aforementioned printed circuit board 1, such that the plurality of protective circuits for a rechargeable cell fabricated on the aforementioned printed circuit board 1 can be separated into individual protective circuits.

Figure 2:
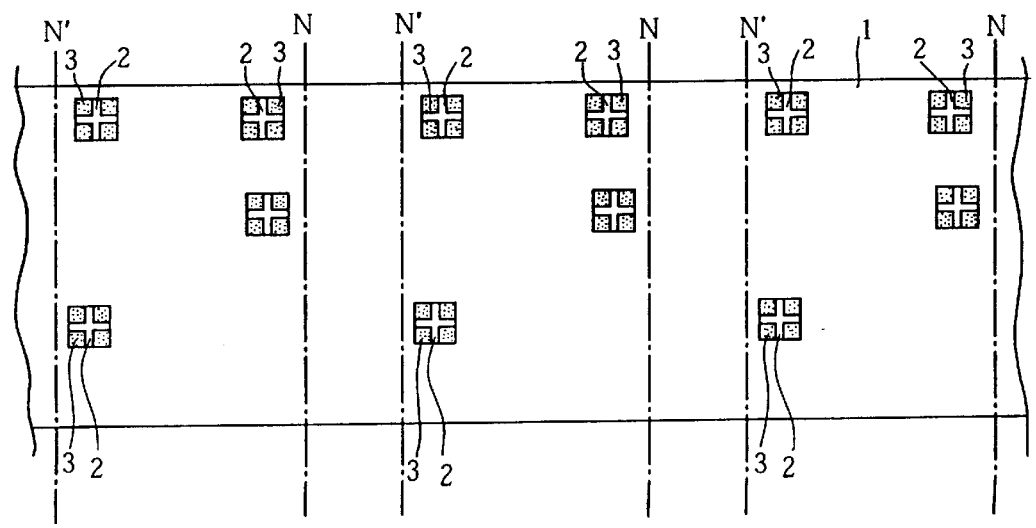
FIG. 2 is a principal plan diagram showing one example of a state wherein solder paste is coated onto the printed circuit board illustrated in FIG. 1.
Figure 3:
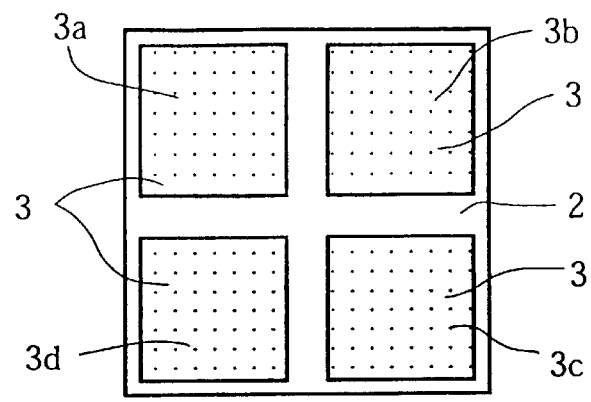
FIG. 3 is a principal enlarged plan view and shows one example of regions onto which solder paste is coated.

In order to manufacture the aforementioned electronic circuit device using the aforementioned printed circuit board 1, firstly, as illustrated in FIG. 2, solder paste 3 is coated to an appropriate thickness onto each of the aforementioned pad regions 2 by screen printing. In this case, by coating the solder paste 3 in a dispersed manner onto the respective four corners of each pad region 2, as illustrated in FIG. 3, a total of four solder paste coating regions 3a–3d are formed, each mutually separated by a prescribed gap. The task of coating the solder paste in this manner can be carried out simultaneously with the task of coating solder paste for soldering prescribed electronic components which constitute the aforementioned protective circuit onto other locations of the printed circuit board 1.

Figure 4:
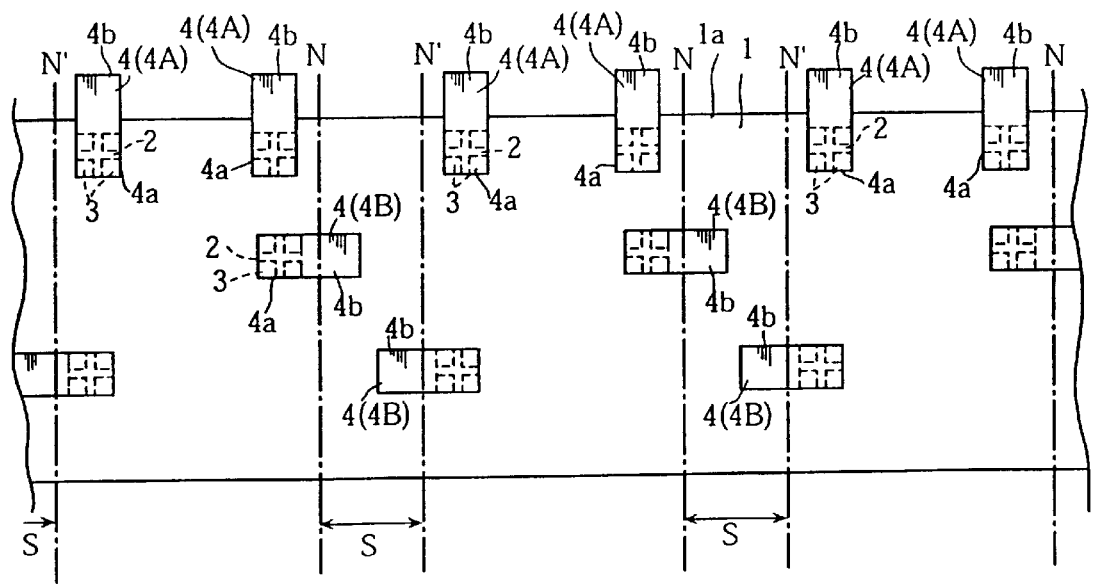
FIG. 4 is a principal plan view showing one example of a state where a terminal is installed on a printed circuit board.

Thereupon, as illustrated in FIG. 4, a plurality of terminals 4 (4A, 4B) are positioned on the printed circuit board 1. In this case, as depicted clearly in FIG. 5, the connecting end 4a of each of the aforementioned terminals 4 is superimposed over the whole of one of the aforementioned solder paste coated regions 3a–3d. A thin metal plate made from nickel, for example, may be used for the aforementioned terminals 4. In the present embodiment, as described later, it is not necessary to provide pins for locating each of the aforementioned terminals 4 onto the printed circuit board 1 in order to obtain a self-alignment effect when the terminal 4 is soldered to the printed circuit board 1. Therefore, the task of mounting the aforementioned terminal 4 can be carried out with good efficiency using a general chip mounting device as used to mount chip-shaped electronic components onto a printed circuit board.

If a portion of terminals 4 (4A) from the aforementioned plurality of terminals are positioned in a side edge region 1a of said printed circuit board 1 extending in the longitudinal direction thereof, then a one-sided configuration is obtained, wherein the corresponding non-connecting ends 4b project externally from the aforementioned first side edge regions 4b. The aforementioned solder paste coated regions 3a–3d are viscous, and when the terminals 4 (4A) are mounted onto the printed circuit board 1 by means of a chip mounting device, their corresponding connecting ends 4a can be pressed into the solder paste coated region 3a–3d by a uniform applied pressure. Consequently, the connecting ends 4a of the aforementioned terminals 4 (4A) can be attached to the solder paste coated regions 3a–3d, thereby making it possible to prevent the terminals 4 (4A) from detaching readily from the printed circuit board 1. On the other hand, the respective non-connecting ends 4b are mounted in the narrow region S between the aforementioned imaginary lines N, N'. This terminal mounting operation can be carried out with good efficiency in combination with the task of mounting prescribed electronic components constituting the aforementioned protective circuit onto the printed circuit board 1, by means of a chip mounting device.

Figure 5:
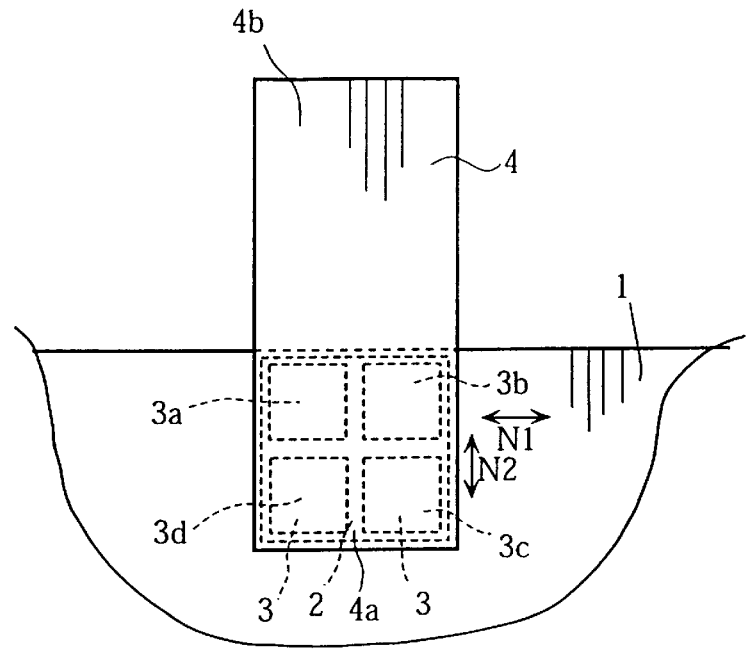
FIG. 5 is a principal enlarged plan view of FIG. 4.

After the task of installing the aforementioned terminals has been completed, the aforementioned printed circuit board 1 is forwarded to a furnace for solder reflowing, where the solder paste 3 in the aforementioned solder paste coated regions 3a–3d is heated and caused to melt. When the solder paste 3 becomes molten, surface tension is generated in the molten solder in the respective solder paste coated regions 3a–3d positioned in a vertical and lateral configuration, as illustrated in FIG. 5, and a self-alignment effect is displayed, whereby this surface tension causes the position of the aforementioned terminals 4 to be aligned.

More specifically, since the aforementioned solder paste coated regions 3a, 3b and the solder paste coated regions 3c, 3d are separated by an interval in the longitudinal direction of the terminal 4, the surface tension of the molten solder in these regions creates a self-alignment effect whereby the aforementioned connecting end 4a is displaced in the lateral direction of the terminal 4 (indicated by arrow N1). Moreover, since the solder paste coated regions 3a, 3d and the solder paste coated regions 3b, 3c are separated by an interval in the lateral direction of the terminal 4, the surface tension of the molten solder in these regions creates a further self-alignment effect whereby aforementioned connecting end 4a is displaced in the longitudinal direction of the terminal 4 (indicated by arrow N2 FIG. 5). Therefore, when each solder paste area in the aforementioned solder paste coated regions 3a–3d becomes molten, the aforementioned connecting end 4a can be displaced to a position wherein it shows little or no distortion with respect to the positions of the solder paste coated regions 3a–3d, and hence the terminal 4 can be located accurately at a desired position. The process of soldering the terminal 4 is completed when the molten solder cools and hardens.

In order to obtain the self-alignment effect described above in a reliable manner, it is desirable for the dimension between the respective solder paste coated regions 3a–3d to be made large. However, in the present embodiment, since the solder paste coated regions 3a–3d are positioned respectively in the four corner regions of each pad region 2, the gap therebetween can be set to a maximum size in such a way than the respective solder paste coated regions 3a–3d do not project beyond the pad region 2. Therefore, the self-alignment effect relating to the terminal 4 can be obtained more reliably.

Figure 6:
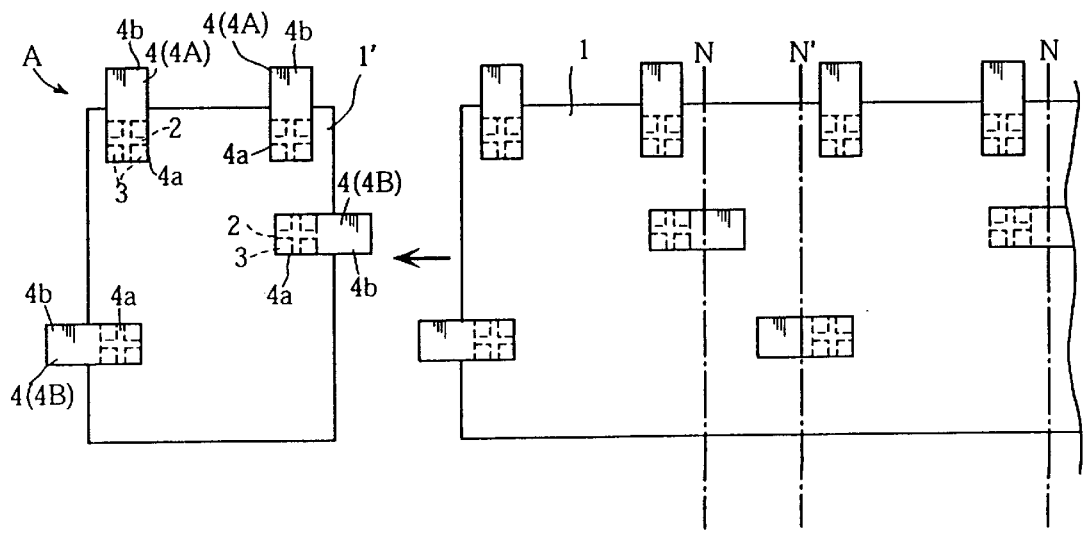
FIG. 6 is a plan view illustrating one example of a step of cutting a printed circuit board.

After the process described above has been completed, the aforementioned printed circuit board 1 is cut at the position of the imaginary lines N, N'. Thereby, a plurality of electronic circuit devices can be obtained. Each of the aforementioned electronic circuit devices A (FIG. 6) has a composition wherein the aforementioned plurality of terminals 4 is soldered to a cut printed circuit board 1' and the respective non-connecting ends 4b of the terminals 4 project externally from the printed circuit board 1'.

Figure 7:
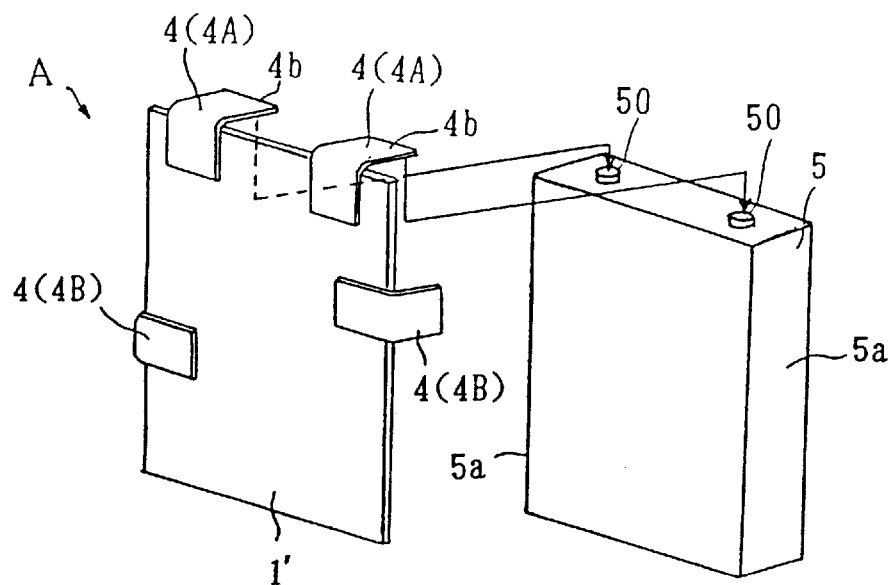
FIG. 7 is an oblique view showing one applicational example of an electronic circuit device manufactured by installing terminals on a printed circuit board.

As illustrated in FIG. 7, for example, in the aforementioned electronic circuit device A, the terminals 4 can be used by bending them. More specifically, two terminals 4A can be placed in contact with two electrodes 50 of a rechargeable cell 5 and spot welded. Moreover, the two terminals 4B can be positioned along either side face 5a, 5a of the rechargeable cell 5, such that they are positioned either side of the rechargeable cell 5. The two terminals 4B can be used, for example, to make an electrical connection to prescribed electronic circuits contained in the main unit of a portable telephone, or the like, into which the aforementioned rechargeable cell 5 is fitted. As stated previously, each of the aforementioned terminals 4 is soldered accurately to a desired position on the printed circuit board 1' by means of the self-alignment effect, and therefore it is possible to place each of the terminals 4 suitably in electrical connection with a prescribed position in relation to the aforementioned rechargeable cell 5.

In the present invention, the specific composition of the solder paste coated regions may be any of the compositions illustrated in FIG. 8 to FIG. 12, for example.

Figure 8:
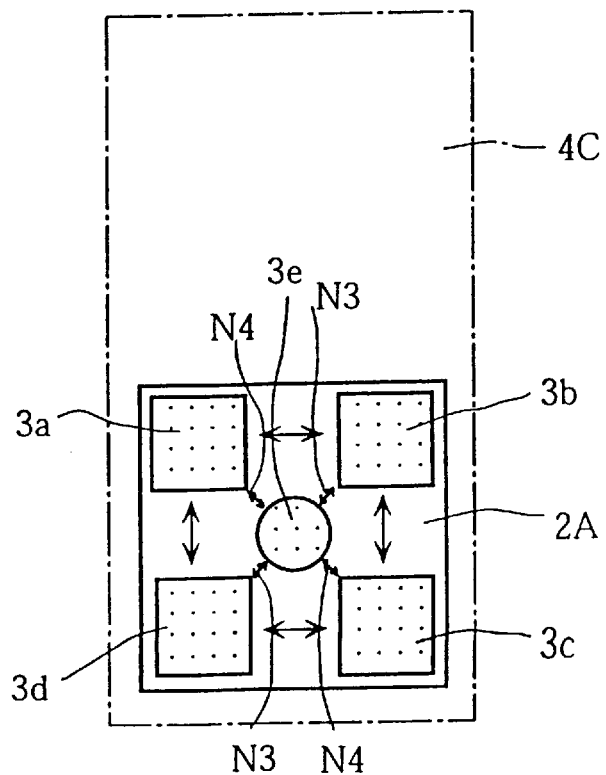
FIG. 8 is an illustrative diagram showing a further example of regions onto which solder paste is coated.

Specifically, in the composition in FIG. 8, as well as providing a total of four solder paste coated regions 3a–3d in the four corner regions of the pad region 2A having an approximate square shape in plan view, a further solder paste coated region 3e is provided in approximately the central portion of the aforementioned pad region 2A. This solder paste coated region 3e is mutually separated from the respective solder paste coated regions 3a–3d. By means of a composition of this kind, in addition to obtaining a self-alignment effect whereby the terminal 4C is aligned in its longitudinal direction and its lateral direction by means of the aforementioned solder paste coated regions 3a–3d, a self-alignment effect is also obtained, whereby the terminal 4C is aligned in the directions (indicated by arrows N3, N4) in which each of the aforementioned solder paste coated regions 3a–3d are located with respect to the solder paste coated region 3e. Therefore, this configuration is more desirable with regard to accurate alignment of the terminal.

Figure 9:
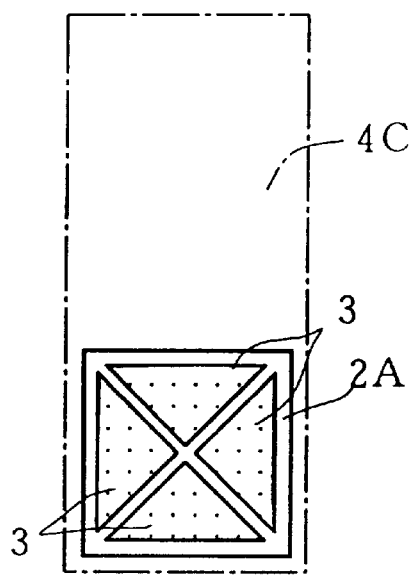
FIG. 9 is an illustrative diagram showing a further example of regions onto which solder paste is coated.
Figure 10:
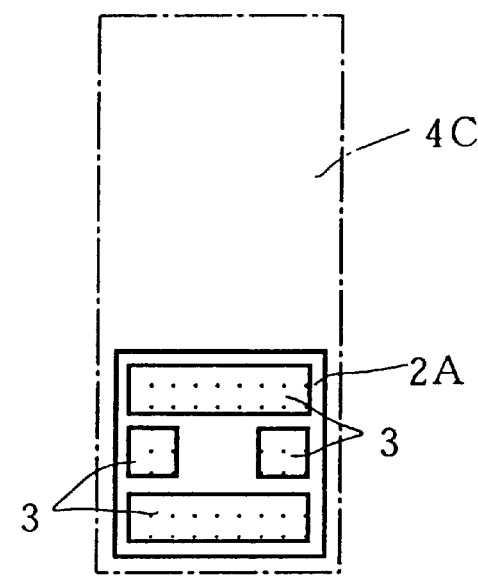
FIG. 10 is an illustrative diagram showing a further example of regions onto which solder paste is coated.
Figure 11:
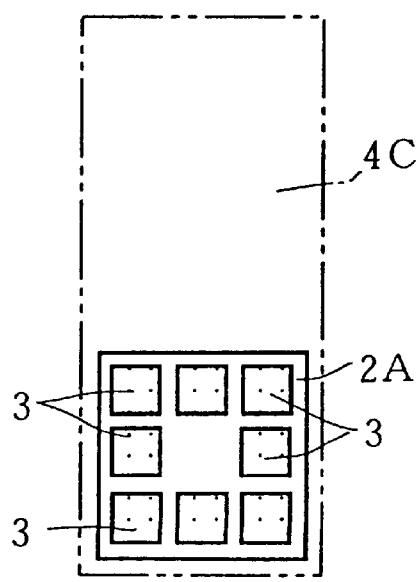
FIG. 11 is an illustrative diagram showing a further example of regions onto which solder paste is coated.
Figure 12:
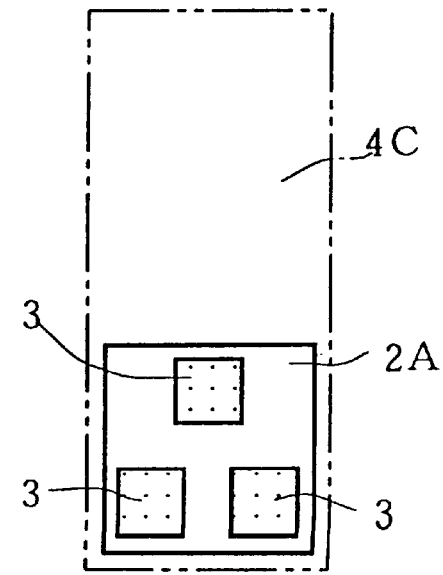
FIG. 12 is an illustrative diagram showing a further example of regions onto which solder paste is coated.

In the compositions illustrated in FIG. 9 to FIG. 11, a variety of different coating region shapes, sizes and configurations are adopted in coating solder paste 3 onto a pad region 2A. In each of these cases, a self-alignment effect is obtained, thereby enabling the position of the terminal 4C to be aligned. In this way, a variety of different modes can be adopted for the solder paste coated regions in the present invention. However, in the present invention, desirably, it is devised that the position of the terminal is aligned in both the longitudinal direction and lateral direction thereof, and in order to achieve this, preferably, a composition is adopted whereby the solder paste 3 is coated onto at least three separate regions, as illustrated in FIG. 12, for example, such that these coated regions are mutually separated by gaps in the longitudinal direction and lateral direction of the terminal 4C.

Figure 13A:
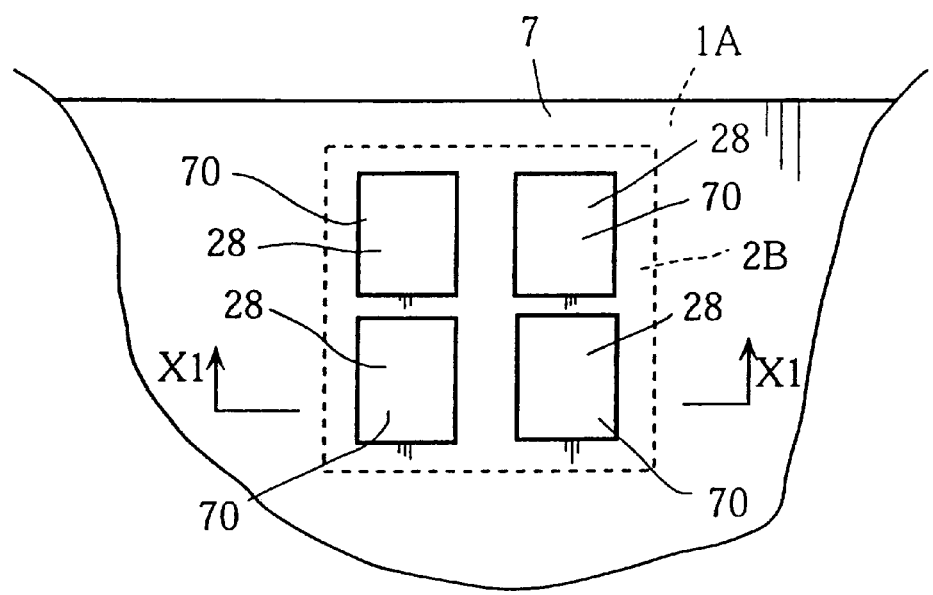
FIG. 13a is a principal plan view showing a further example of a printed circuit board.
Figure 13B:
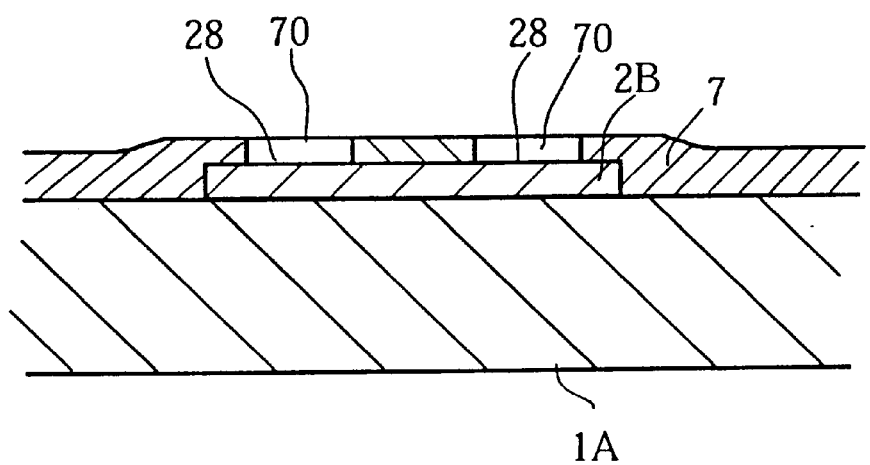
FIG. 13b is a sectional view of same along line X1—X1.
Figure 14A:
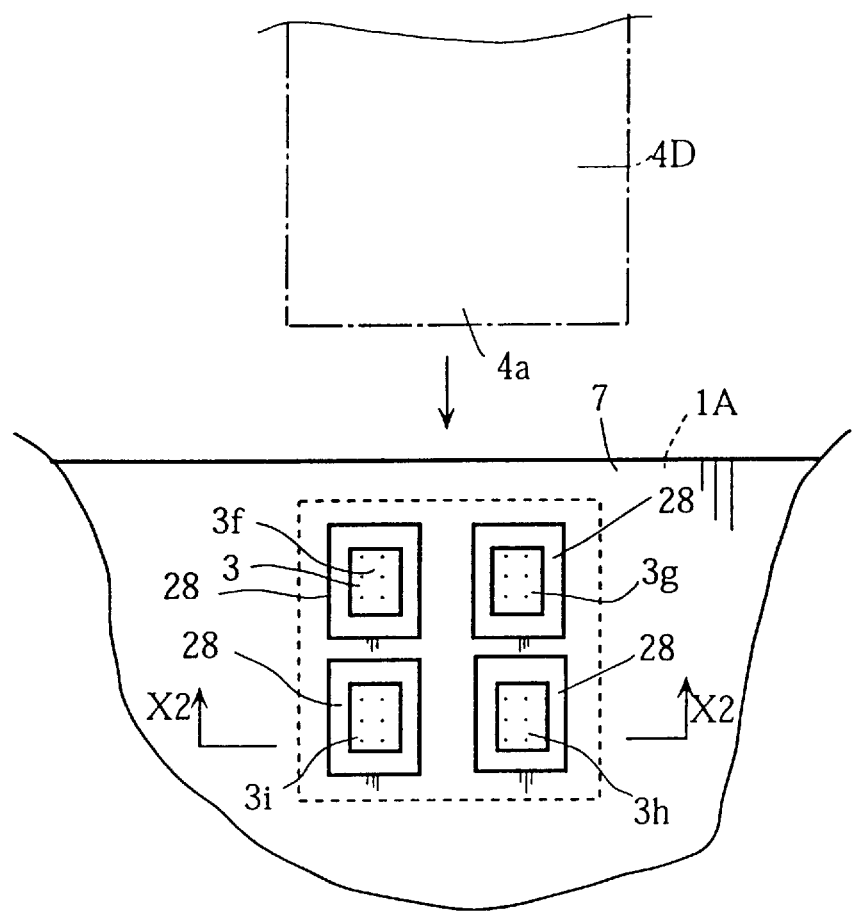
Figure 14B:
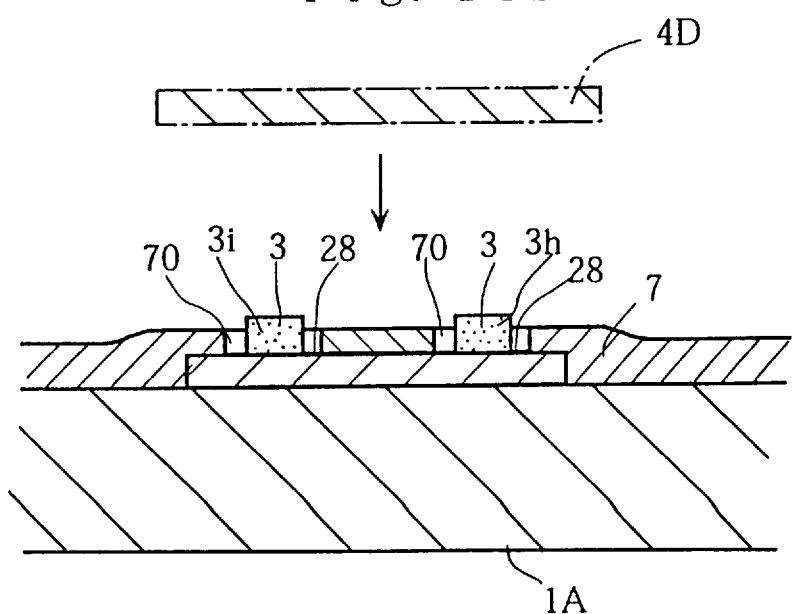
FIG. 14b is a sectional view of same along line X2—X2.

Moreover, in the present invention, the following method may be used for implementing the step of coating solder paste. Specifically, as illustrated in FIG. 13a and FIG. 13b, after forming prescribed electrically conductive wiring patterns (omitted from the drawings) onto the printed circuit board 1A, processing for covering the surface thereof with a green resist layer is carried out. This is aimed at providing insulation for the aforementioned conductive wiring pattern. In this case, by providing a plurality of openings 70 in the aforementioned green resist layer 7 to the upper portion of a pad region 2B made from copper foil, a plurality of metal surface regions 28 are formed wherein the metal surface of the copper foil is externally exposed. This plurality of metal surface regions 28 comprises the surfaces at the four corner regions of the aforementioned pad region 2, each region being demarcated and mutually separated by a portion of the aforementioned green resist layer 7. Each of the aforementioned openings 70 can be provided by forming the aforementioned green resist layer 7 and then carrying out etching on the green resist layer 7. Thereupon, as illustrated in FIG. 14a and FIG. 14b, solder paste 3 is coated separately onto the respective surfaces of the aforementioned plurality of metal surface regions 28, thereby providing a plurality of solder paste coated regions 3f–3i. Desirably, the surface area of each of this plurality of solder paste coated regions 3f–3i is smaller than the surface area of each of the aforementioned metal surface regions 28. After the process of coating the solder paste 3, the connecting end 4a of the terminal 4D is superimposed on the aforementioned solder paste coated regions 3f–3i.

Once the sequence of tasks described above has been completed, if the solder paste in the solder paste coated regions 3f–3i is heated and caused to melt, the molten solder will not be liable to flow outside each of the aforementioned metal surface regions 28. This is because the molten solder forms a more familiar contact with the metal surface than with the green resist layer 7. Moreover, due to similar reasons, an effect can be anticipated whereby, even if the aforementioned solder paste coated regions 3f–3i have generated a degree of overflowing outside the aforementioned openings 70, when molten, the solder will collect onto the aforementioned metal surface regions 28. Therefore, it is possible to resolve the problem of molten solder in the solder paste coated regions 3f–3i solidifying in lumps, without raising the positional accuracy of the aforementioned solder paste coated regions 3f–3i to a great extent. Consequently, it is possible to obtain a suitable self-alignment effect by utilizing the surface tension of the molten solder located in a plurality of separate areas. In the present invention, the actual method of forming the metal surface regions is of course not limited to the method described above. Furthermore, the actual configuration of the metal surface regions can be altered to a variety of different configurations, similarly to the modes of configuring the solder paste coated regions as illustrated in FIG. 8 to FIG. 12.

Next, a further embodiment of the present invention is described with reference to FIG. 15 to FIG. 17.

Figure 15:
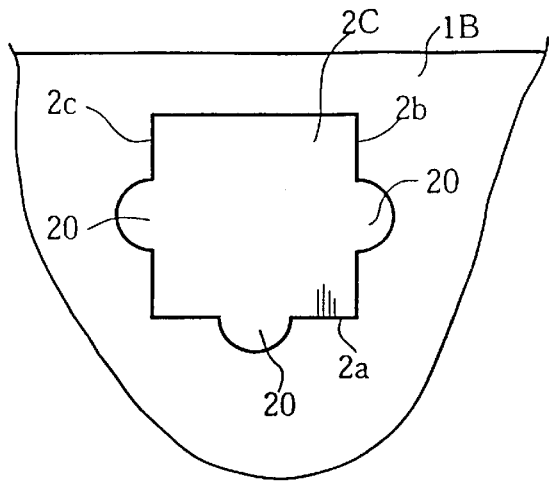
FIG. 15 is a principal plan view showing a further example of a printed circuit board to which the method for installing terminals on a printed circuit board relating to the present invention is applied.
Figure 16:
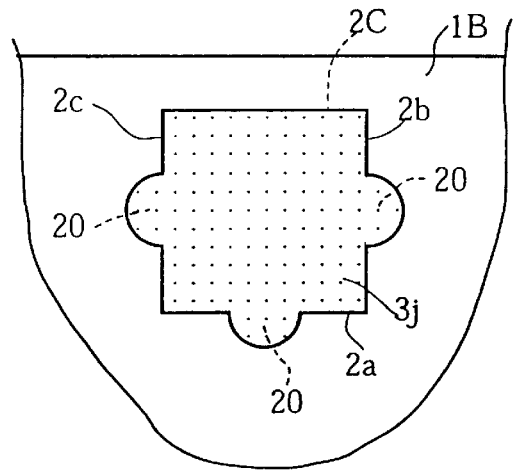
FIG. 16 is a principal plan view showing a state where solder paste is coated onto the printed circuit board illustrated in FIG. 15.

In the present embodiment, firstly, in a case where a pad region 2C made from copper foil is formed on the surface of a printed circuit board 1B, as illustrated in FIG. 15, semi-circular projecting regions 20 are formed respectively in the central portions, in the longitudinal direction, of three side edges 2a–2c of a pad region 2C. Next, as illustrated in FIG. 16, solder paste 3 is coated onto the surface of the aforementioned pad region 2C. In this case, the aforementioned solder paste 3 is coated onto the surface of the three projecting regions 20. Thereby, a solder paste coated region 3j comprising a total of three protruding sections 30 having a semicircular shape in plan view are provided on the aforementioned pad region 2C.

Figure 17:
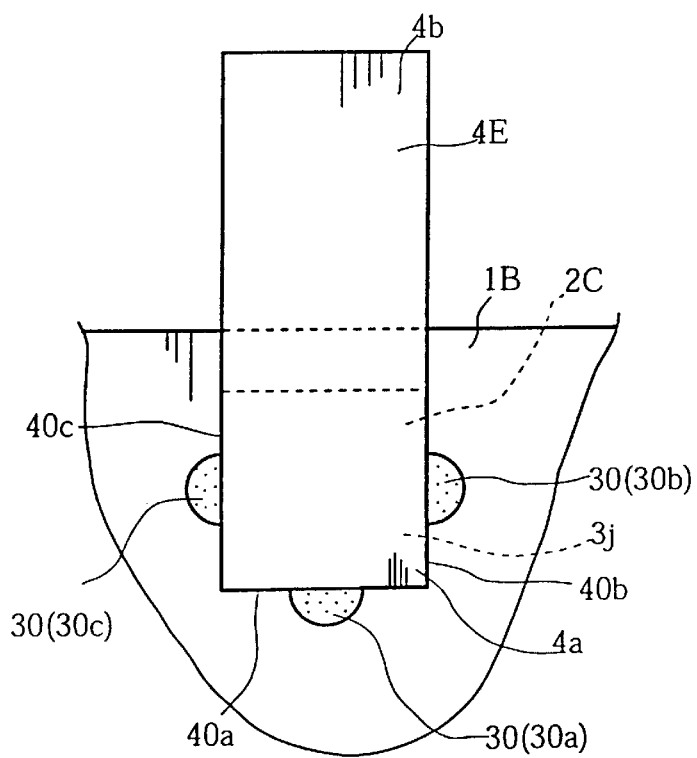
FIG. 17 is a principal plan view showing a state where a terminal is superimposed on the regions onto which solder paste is coated illustrated in FIG. 16.
Figure 18:
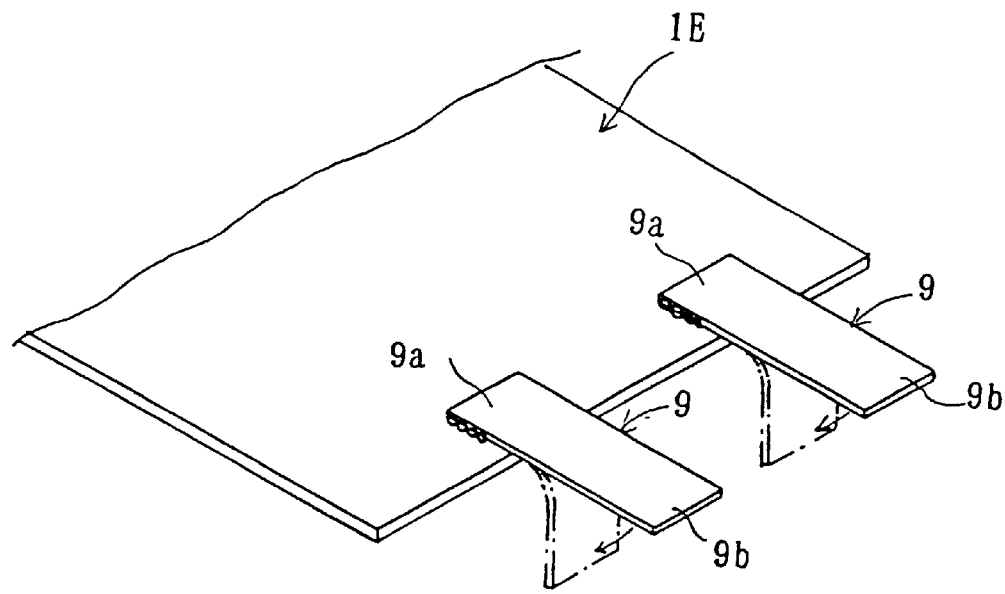
FIG. 18 is a principal oblique view showing a conventional example of a structure wherein terminals are installed on a circuit board.
Figure 19:
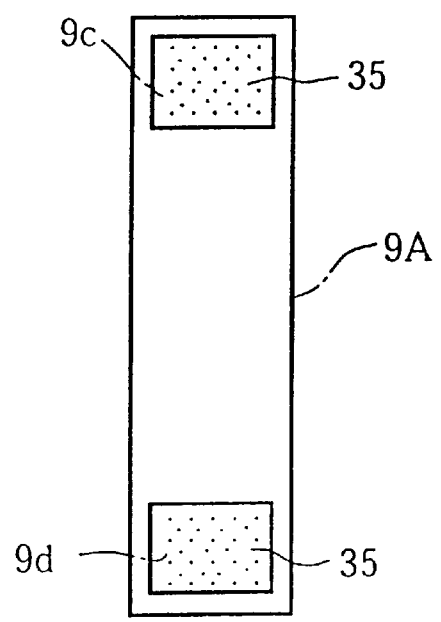
FIG. 19 is an illustrative diagram of self-alignment effects obtained by means of a reflow soldering method.

After the task of coating the solder paste has been completed, a terminal 4E is mounted onto the printed circuit board 1B, as shown in FIG. 17, and the connecting end 4a thereof is laid onto the aforementioned solder paste coated region 3j. The connecting end 4a comprises a first edge 40a extending in the lateral direction of the terminal 4E and two edges 40b, 40c extending in the longitudinal direction of the terminal 4E and connected to the first edge 40a. When the aforementioned connecting end 4a is laid onto the solder paste coated region 3j, the aforementioned three protruding regions 30 each project respectively beyond the first edge 40a and the second edges 40b, 40c. In this way, the task of superimposing the terminal 4E onto the solder paste coated region 3j can be carried out by means of a chip mounting device, similarly to the previous embodiment.

Thereupon, the printed circuit board 1B is transported to a furnace for solder reflow processing, where the solder paste in the solder paste coated region 3j is heated and caused to melt. By so doing, the surface tension of the molten solder in the aforementioned three protruding regions 30 acts upon the first edge 40a and the second edges 40b, 40c. In this case, the three protruding sections 30 are separated spatially in the lateral direction of the terminal 4E, and furthermore, one of the protruding sections 30 (30a) is separated spatially from the other protruding sections 30 (30b, 30c) in the longitudinal direction of the terminal 4E. Consequently, a self-alignment effect can be obtained whereby, due to the action of the surface tension of the molten solder, the aforementioned connecting end 4a is displaced in the lateral direction and longitudinal direction of the terminal 4E, causing the connecting end 4a to be aligned centrally with respect to the three protruding regions 30. Therefore, it is possible to solder the connecting end 4a onto the pad region 2C accurately. Furthermore, after soldering has been completed, the aforementioned protruding regions can be viewed readily from outside, thereby enabling accurate judgement to be made with regard to whether or not the terminal 4E has been soldered in position correctly.

In the present invention, the specific number of protruding regions provided in the solder paste coated region is not limited. More than three protruding regions may also be provided in the present invention. Furthermore, it is also possible, for example, to provide only two protruding regions 30b, 30c, omitting one of the protruding regions 30a of the three protruding regions 30 (30a–30c) shown in FIG. 17. Even if this composition is adopted, it is still possible to obtain a self-alignment effect by the action of the surface tension of molten solder in the aforementioned two protruding regions 30b, 30c. However, in the present invention, desirably, it should be made possible to align the position of the terminal in both the longitudinal direction and lateral direction thereof by providing at least three or more protruding regions.

The present invention is not limited to the contents of the embodiments described above. The present invention can be applied also to cases where a terminal is installed in such a manner that the non-connecting end thereof does not project beyond the printed circuit board. Moreover, the solder paste and solder referred to in the present invention is not limited to Sn—Pb alloys, but rather is a concept which includes a variety of electronic engineering solders containing different components. Furthermore, the circuit board referred to in the present invention is not limited to a printed circuit board made from epoxy resin, or the like, but rather is a concept which includes flexible circuit boards, for example. Naturally, the specific composition of the electronic circuitry and electrical circuitry fabricated on the circuit board is not limited. The present invention may be applied also to cases where solder paste is coated onto portions of the printed circuit board where no pad regions are provided.

INDUSTRIAL APPLICABILITY

The method for installing terminals onto a circuit board, and the circuit board according to the present invention can be used for applications wherein terminals are installed on a variety of circuit boards comprising electrical circuits or electronic circuits.

What is claimed is:

1. A method for installing a plurality of terminals onto a circuit board, each said terminal having a connecting end and a non-connecting end, the circuit board having an outer contour and being formed with a corresponding number of pads, the method comprising the steps of:

forming a plurality of solder paste deposits on each said pad;

superimposing the connecting end of each said terminal on a respective one of the pads in a manner such that the connecting end of each said terminal extends over the plurality of solder paste deposits on said respective pad while the non-connecting end of each said terminal protrudes beyond the outer contour of the circuit board; and heating the plurality of solder paste deposits on said respective pad to melt for soldering the connecting end of each said terminal to the circuit board.

2. The method according to claim 1, wherein the plurality of solder paste deposits on each said pad are spaced from each other both in a first direction and a second direction perpendicular to the first direction.

3. The method according to claim 1, wherein each said pad has an approximate square shape comprising four corners, the plurality of solder paste deposits on each said pad including four solder paste deposits provided at the corners of each said pad, respectively.

4. The method according to claim 3, wherein the plurality of solder paste deposits on each said pad also includes a central solder paste deposit provided centrally of each said pad.

5. A circuit board including a mounting surface and an outer contour, the circuit board comprising:

a plurality of pads formed on the mounting surface;

a plurality of solder paste deposits formed on each of the pads; and a corresponding number of terminals each connected to the mounting surface by means of the plurality of solder paste deposits at a respective one of the pads, each said terminal having a connecting end and a non-connecting end;

wherein the connecting end of each said terminal extends over the plurality of solder paste deposits on said respective pad while the non-connecting end of each said terminal protrudes beyond the outer contour of the circuit board.

6. The circuit board according to claim 5, wherein the plurality of solder paste deposits on each said pad are spaced from each other both in a first direction and a second direction perpendicular to the first direction.

7. The circuit board according to claim 5, wherein each said pad has an approximate square shape comprising four corners, the plurality of solder paste deposits on each said pad including four solder paste deposits provided at the corners of each said pad, respectively.

8. The circuit board according to claim 7, wherein the plurality of solder paste deposits on each said pad also includes a central solder paste deposit provided centrally of each said pad.

9. A method for installing a plurality of terminals onto a circuit board, each of the terminals having a connecting end and a non-connecting end, the circuit board having an outer contour and being formed with a corresponding number of pads, the method comprising the steps of:

forming a solder paste deposit on each said pad in a manner such that the solder paste deposit includes a plurality of excess portions protruding beyond each said pad;

superimposing the connecting end of each said terminal on a respective one of the pads in a manner such that the excess portions of the solder paste deposit on said respective pad also protrudes beyond the connecting end of each said terminal while the non-connecting end of each said terminal protrudes beyond the outer contour of the circuit board; and heating the solder paste deposit on said respective pad to melt for soldering the connecting end of each said terminal to the circuit board.

10. The method according to claim 9, wherein the plurality of excess portions on each said pad protrude beyond each said terminal widthwise and longitudinally thereof.

11. A circuit board including a mounting surface and an outer contour, the circuit board comprising:

a plurality of pads formed on the mounting surface;

a solder paste deposit formed on each of the pads to include a plurality of excess portions protruding beyond each said pad; and a corresponding number of terminals each connected to the mounting surface by means of the solder paste deposit at a respective one of the pads, each said terminal having a connecting end and a non-connecting end;

wherein the excess portions of the solder paste deposit on each said pad also protrude beyond the connecting end of each said terminal while the non-connecting end of each said terminal protrudes beyond the outer contour of the circuit board.

12. The circuit board according to claim 11, wherein the plurality of excess portions on each said pad protrude beyond each said terminal widthwise and longitudinally thereof.

* * * * *